(12) United States Patent
Knaipp et al.

(10) Patent No.: US 10,283,635 B2
(45) Date of Patent: May 7, 2019

(54) FIELD EFFECT TRANSISTOR DEVICE WITH SEPARATE SOURCE AND BODY CONTACTS AND METHOD OF PRODUCING THE DEVICE

(71) Applicant: ams AG, Premstaetten (AT)

(72) Inventors: Martin Knaipp, Premstaetten (AT); Georg Roehrer, Lebring-Sankt Margarethen (AT); Jong Mun Park, Graz (AT)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 15/803,636

(22) Filed: Nov. 3, 2017

(65) Prior Publication Data

US 2018/0130906 A1    May 10, 2018

(30) Foreign Application Priority Data

Nov. 7, 2016   (EP) .................................... 16197521

(51) Int. Cl.
| | |
|---|---|
| *H01L 29/08* | (2006.01) |
| *H01L 29/78* | (2006.01) |
| *H01L 29/423* | (2006.01) |
| *H01L 29/06* | (2006.01) |
| *H01L 29/10* | (2006.01) |
| *H01L 21/265* | (2006.01) |
| *H01L 23/522* | (2006.01) |

(Continued)

(52) U.S. Cl.
CPC .... *H01L 29/7833* (2013.01); *H01L 21/26513* (2013.01); *H01L 23/5226* (2013.01); *H01L 23/535* (2013.01); *H01L 29/0692* (2013.01); *H01L 29/0869* (2013.01); *H01L 29/1041* (2013.01); *H01L 29/1095* (2013.01); *H01L 29/4238* (2013.01); *H01L 29/66492* (2013.01); *H01L 29/7816* (2013.01); *H01L 29/086* (2013.01)

(58) Field of Classification Search
CPC ............. H01L 29/0696; H01L 29/0852; H01L 29/0865; H01L 29/0869; H01L 29/1095; H01L 29/66674; H01L 29/66681; H01L 29/7801; H01L 29/7816; H01L 21/048; H01L 21/0485; H01L 21/22; H01L 21/28
See application file for complete search history.

(56) References Cited

U.S. PATENT DOCUMENTS

| | | |
|---|---|---|
| 7,405,128 B1 | 7/2008 | Khemka et al. |
| 8,963,243 B2 | 2/2015 | Park et al. |
| 9,871,135 B2 * | 1/2018 | Lin ..................... H01L 29/7823 |

(Continued)

FOREIGN PATENT DOCUMENTS

EP    3098857 A1    11/2016

*Primary Examiner* — Eduardo A Rodela
(74) *Attorney, Agent, or Firm* — Fish & Richardson P.C.

(57) ABSTRACT

The field effect transistor device comprises a substrate (1) of semiconductor material, a body well of a first type of electric conductivity in the substrate, a source region in the body well, the source region having an opposite second type of electric conductivity, a source contact (3) on the source region, a body contact region of the first type of electric conductivity in the body well, a body contact (5) on the body contact region, and a gate electrode layer (2) partially overlapping the body well. A portion (2*) of the gate electrode layer (2) is present between the source contact (3) and the body contact (5).

16 Claims, 5 Drawing Sheets

(51) Int. Cl.
*H01L 23/535* (2006.01)
*H01L 29/66* (2006.01)

(56) References Cited

U.S. PATENT DOCUMENTS

| | | | |
|---|---|---|---|
| 9,960,236 B2* | 5/2018 | Girdhar | H01L 29/1087 |
| 2005/0151189 A1* | 7/2005 | Brambilla | H01L 29/0696 257/335 |
| 2010/0078774 A1* | 4/2010 | Hirler | H01L 29/0653 257/652 |
| 2012/0049277 A1 | 3/2012 | Lin et al. | |
| 2012/0187483 A1 | 7/2012 | Yang et al. | |
| 2015/0035056 A1* | 2/2015 | Kuwazawa | H01L 29/7816 257/343 |
| 2015/0123206 A1 | 5/2015 | Hung et al. | |

* cited by examiner

US 10,283,635 B2

FIELD EFFECT TRANSISTOR DEVICE WITH SEPARATE SOURCE AND BODY CONTACTS AND METHOD OF PRODUCING THE DEVICE

BACKGROUND OF THE INVENTION

A field effect transistor cell comprises the areas of source, drain and body including a channel region. In symmetrical field effect transistors, the cell size is defined by the distance from the axis of symmetry of the body region to the axis of symmetry of the drain region. Small cell sizes are especially important in output stages to achieve a small on-resistance. The cell size is reduced if source and body are provided with a common contact, but this excludes the application of different voltages to source and body, which may be required in some designs of integrated circuits.

U.S. Pat. No. 8,963,243 discloses a p-channel LDMOS transistor with a semiconductor substrate provided with a well of n-type conductivity. A p-type source region, a $p^+$-type source contact region and an n-type body contact region are arranged in the well. The contact regions are separated by an isolation region and provided with separate contacts.

US 2015/0123206 A1 discloses a field effect transistor provided with a body-contact. A gate strip is disposed on a first portion of the active region of a substrate. Source and drain regions are disposed on second and third portions of the active region adjacent to opposite sides of the gate strip. A body-contact region is disposed on a fourth portion of the active region separated from the gate strip by a fifth portion of the active region. The fifth portion of the active region is not covered by any silicide features.

SUMMARY OF THE INVENTION

The field effect transistor device comprises a substrate of semiconductor material, a body well of a first type of electric conductivity in the substrate, a source region in the body well, the source region having an opposite second type of electric conductivity, a source contact on the source region, a body contact region of the first type of electric conductivity in the body well, a body contact on the body contact region, and a gate electrode layer partially overlapping the body well. A portion of the gate electrode layer is present between the source contact and the body contact.

In particular, the first type of electric conductivity may be n-type conductivity. In this case, the second type of electric conductivity is p-type conductivity. The first type of electric conductivity may instead be p-type conductivity and the second type of electric conductivity n-type conductivity.

An embodiment of the device comprises a source spacer and a body spacer at the gate electrode layer. The source spacer is arranged between the gate electrode layer and the source contact, and the body spacer is arranged between the gate electrode layer and the body contact. The body contact may be laterally surrounded by the gate electrode layer.

In a further embodiment, areas of the substrate under the source spacer and under the body spacer are free from silicide.

The source contact may be one of a plurality of source contacts, which are arranged on a straight line. The body contact may also be one of a plurality of body contacts arranged on the straight line, and in particular at equal distances from one another. In particular, the same number of the source contacts may be arranged between any two of the body contacts that immediately follow one another in the sequence of body contacts.

A further embodiment comprises a source extension of the second type of electric conductivity, the source extension extending the source region under the gate electrode layer. The electric conductivity of the source extension is lower than the electric conductivity of the source region. The source extension is embedded in a halo implant of the first type of electric conductivity.

A further embodiment comprises a first metal layer above the substrate. A first portion of the first metal layer contacts the source contact, and a second portion of the first metal layer contacts the body contact.

A further embodiment comprises a second metal layer above the first metal layer. The first portion of the first metal layer is connected to a first portion of the second metal layer by a first via, which forms a vertical electric interconnection, or by a plurality of first vias, and the second portion of the first metal layer is connected to a second portion of the second metal layer by a second via or by a plurality of second vias.

The method of producing a field effect transistor device comprises forming a body well of a first type of electric conductivity in a substrate of semiconductor material, forming a source region in the body well, the source region having an opposite second type of electric conductivity, applying a source contact on the source region, forming a body contact region of the first type of electric conductivity in the body well, applying a body contact on the body contact region, forming a gate electrode layer partially overlapping the body well, and forming a body spacer at the gate electrode layer.

The body spacer is formed covering an area of the substrate that is free from silicide and surrounding an area provided for the body contact region. The body contact region is formed self-aligned to the gate electrode layer and the body spacer by an implantation of dopant using a mask that has an opening above the region that is provided for the body contact region.

The gate electrode layer is formed in such a manner that a portion of the gate electrode layer is arranged between the source contact and the body contact. If the body contact is arranged between two source contacts, portions of the gate electrode layer may be arranged between the body contact and each of the source contacts.

In a variant of the method, a source spacer is formed at the gate electrode layer. The source spacer covers an area of the substrate that is free from silicide and surrounds an area provided for the source region. The source region is formed self-aligned to the gate electrode layer and the source spacer by an implantation of a further dopant.

In a further variant of the method, a halo implant is formed in an area provided for the source region by an implantation of dopant for the first type of electric conductivity. A source extension is formed in the halo implant by an implantation of dopant for the second type of electric conductivity. The source extension extends the source region under the gate electrode layer towards the channel region. The electric conductivity of the source extension is lower than the electric conductivity of the source region. This is achieved by a lower net doping concentration of the source extension, where the doping for the second type of electric conductivity overcompensates the first type of electric conductivity provided by the body well and the halo implant.

In a further variant of the method, the implantation of dopant for the second type of electric conductivity that is provided for the source extension is also performed in an area provided for the body contact region. The body contact region is formed by an implantation of dopant for the first type of electric conductivity, which overcompensates the implantation for the second type of conductivity and results in a net doping of the first type of electric conductivity throughout the body contact region.

In a further variant of the method, the implantation of the body contact region is deeper than the implantation of the source extension.

If the source contact is one of a plurality of source contacts on a straight line, and the body contact is one of a plurality of body contacts arranged on the straight line at a distance from one another, a portion of the gate electrode layer is arranged on the straight line between the source contact and the body contact.

The following is a detailed description of examples of the device and the method in conjunction with the appended figures.

DETAILED DESCRIPTION

Figure 1:
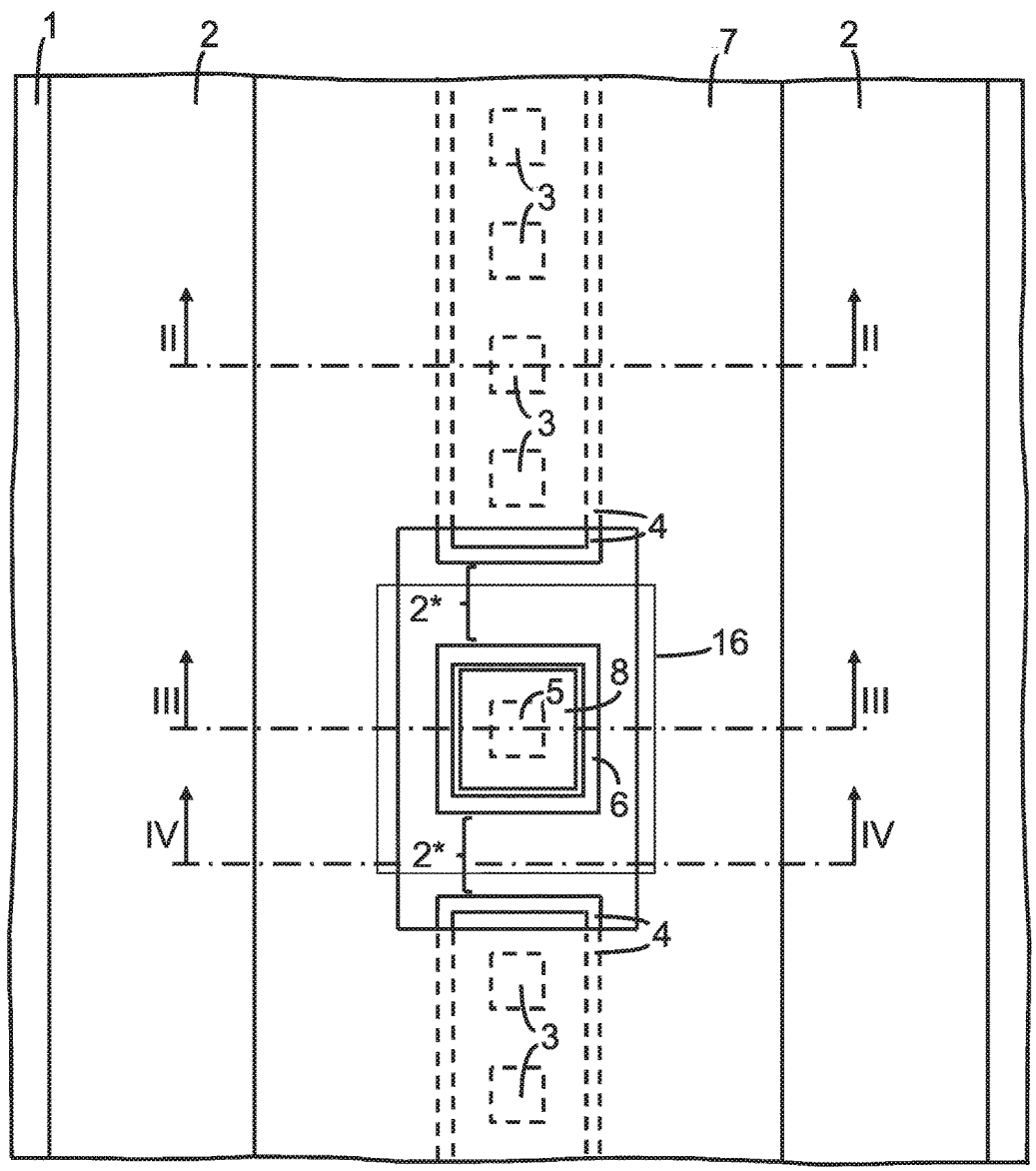
FIG. 1 is a section of a top view of an embodiment of the device including a first metal layer.

FIG. 1 is a section of a top view of an embodiment of the field effect transistor device including only the first metal layer. Hidden contours are represented with broken lines. The field effect transistor device comprises a substrate 1 of semiconductor material, which may especially be silicon, for instance. A structured gate electrode layer 2, which may be electrically conductive polysilicon, for instance, is arranged above the surface of the substrate 1. A body well is formed in the substrate 1. A source region or a plurality of source regions and a body contact region or a plurality of body contact regions are formed in the body well.

At least one source contact 3 is arranged on the source region, and at least one body contact 5 is arranged on the body contact region. The source contact 3 and the body contact 5 may in particular be arranged on a straight line in the direction that is vertical in FIG. 1.

The device may comprise a plurality of source contacts 3, and it may comprise a plurality of body contacts 5. In the embodiment according to FIG. 1, only one of the body contacts 5 is arranged between groups of source contacts 3. A group of body contacts 5 may instead be arranged between source contacts 3.

At least one spacer of dielectric material, which is here referred to as source spacer 4, can be arranged at edges of the gate electrode layer 2 facing the source contact 3. The source spacer 4 may especially surround a group of source contacts 3. There may be a plurality of source spacers 4, and each of the source spacers 4 may surround a separate group of source contacts 3. The source contacts 3 may be arranged at a small distance from the neighboring source spacer 4.

At least one further spacer of dielectric material, which is here referred to as body spacer 6, can be arranged at further edges of the gate electrode layer 2 facing the body contact 5. The body spacer 6 may surround a single body contact 5, as shown in FIG. 1, or a group of body contacts 5. There may be a plurality of body spacers 6, and each of the body spacers 6 may surround a single body contact 5 or a group of body contacts 5. The body contacts 5 may be arranged at a small distance from the neighboring body spacer 6.

The source contact 3 is connected with a first portion 7 of a first metal layer. If the transistor cell comprises a plurality of source contacts 3, each source contact 3 is connected with the first portion 7 of the first metal layer. The body contact 5 is connected with a second portion 8 of the first metal layer. If the transistor cell comprises a plurality of body contacts 5, each body contact 5 is connected with the second portion 8 of the first metal layer.

In the top view of FIG. 1, the source contacts 3 and parts of the source spacers 4 are covered by the first portion 7 of the first metal layer and are therefore shown as hidden contours with broken lines. Similarly, the body contact 5 is covered by the second portion 8 of the first metal layer. The gate electrode layer 2 is partially covered by the first portion 7 of the first metal layer.

Electrically conductive vias may be provided for an electric connection of the gate electrode layer 2 with a further portion of the first metal layer. In particular, the electrically conductive vias may be arranged outside the active area, especially above an insulating region, which may be formed by a field oxide, for instance. Details of an electric connection of the gate electrode layer 2 that are not relevant for this description are not shown in the figures.

FIG. 1 shows how the edges of the gate electrode layer 2 facing the source contacts 3 and the body contact 5 may be lined with the source spacers 4 and the body spacer 6. Portions 2* of the gate electrode layer 2 are present between the body contact 5 and the adjacent source contacts 3. These portion 2* of the gate electrode layer 2 allow to implant the body contact region at a distance from the source regions and afterwards separate the body contact 5 from the adjacent source contacts 3.

The mask 16, which is used in the implantation of the body contact region, is schematically indicated in FIG. 1. The mask 16 may be applied on the gate electrode layer 2 and on regions of the active area that are not covered by the gate electrode layer 2. The mask 16 comprises an opening above the region that is provided for the body contact region.

In FIG. 1 three locations of cross sections II, III and IV are indicated. These cross sections are respectively shown in FIGS. 2, 3 and 4, which are described in the following.

Figure 2:
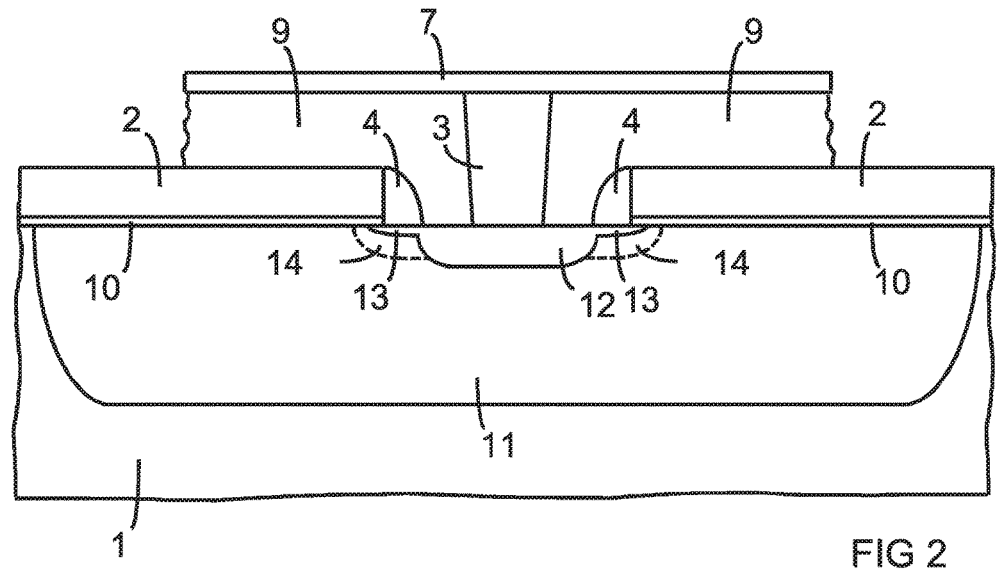
FIG. 2 is a cross section of the device at the location indicated in FIG. 1 with arrows II.

FIG. 2 is a cross section through a source contact 3. It shows the substrate 1 with the body well 11 and the gate electrode layer 2, which is arranged on a gate dielectric 10. The body well 11 is doped for a first type of electric conductivity, which may be n-type conductivity, for instance. The source spacer 4 is arranged at the lateral edges of the gate electrode layer 2 facing the source contact 3. The area of the substrate 1 that is covered by the source spacer 4 is thus prevented from being silicided. A short circuit, which may be due to an uninterrupted silicide layer, is thereby avoided between the contacts. FIG. 2 also shows part of an intermetal dielectric 9, on which the first portion 7 of the first metal layer is applied.

The source region 12 is formed in the body well 11. A source extension 13 of lower doping concentration and hence lower electric conductivity may be provided towards the channel region, which is located under the gate electrode layer 2. The source extension 13 is overlapped by the gate electrode layer 2. The source region 12 and the source extension region 13 are doped for the opposite second type of electric conductivity, which may be p-type conductivity, for instance. The types of conductivity may instead be reversed. A halo implant 14 for the first type of electric conductivity may be provided for the source extension 13. An implantation of a moderately doped region in an oppositely doped halo region may also be used to form an LDD (lightly doped drain) region, which extends the drain region towards the channel region.

Figure 3:
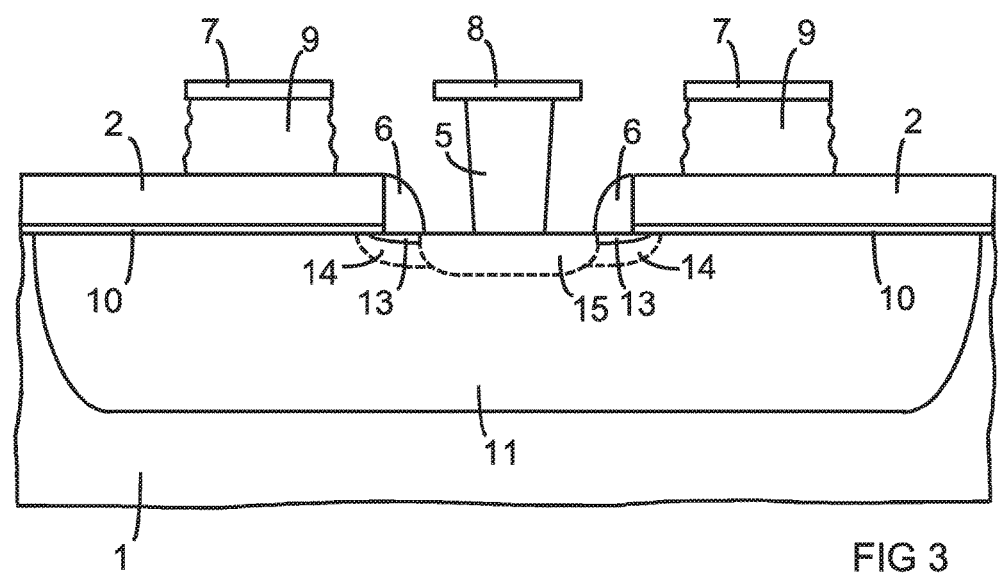
FIG. 3 is a cross section of the device at the location indicated in FIG. 1 with arrows III.

FIG. 3 is a cross section through a body contact 5. It shows the substrate 1 with the body well 11 and the gate electrode layer 2, which is arranged on the gate dielectric 10. The body spacer 6 is arranged at the lateral edges of the gate electrode layer 2 facing the body contact 5. The area of the substrate 1 that is covered by the body spacer 4 is thus also prevented from being silicided. FIG. 3 shows part of the intermetal dielectric 9, on which the first portion 7 and the second portion 8 of the first metal layer are applied.

The body contact region 15 is formed by an implantation of dopant for the first type of electric conductivity. The implantation of the body contact region 15 is deeper than the source extension 13, so that the body contact region 15 continuously extends into the body well 11, as indicated in FIG. 3 by the central broken line.

The halo implant 14 has the first type of electric conductivity and can be used for the body contact region 15 as well. It is not necessary to apply a dedicated LDD mask shielding the implantation for the source extension 13 from the body contact region 15. Since no mask openings obeying LDD design rules have to be produced, the area of the body contact region 15 can be made extremely small. The implantation for the body contact region 15 can be deeper than the implantation of the halo implant 14, as shown in FIG. 3 by way of example, or vice versa.

The source region 12 and the body contact region 15 are formed self-aligned to the gate electrode layer 2, including the source spacers 4 and the body spacers 6, respectively, as shown in FIGS. 2 and 3. Therefore the gate electrode layer 2, and in particular portion 2* of the gate electrode layer 2 does not overlap with the source region 12 and the body contact region 15. The vertically shallower portions of the source spacers 4 and the body spacers 6 may not completely shield the implantations, so that the margins of the source region 12 and the body contact region 15 may slightly extend under the source spacers 4 and the body spacers 6.

Figure 4:
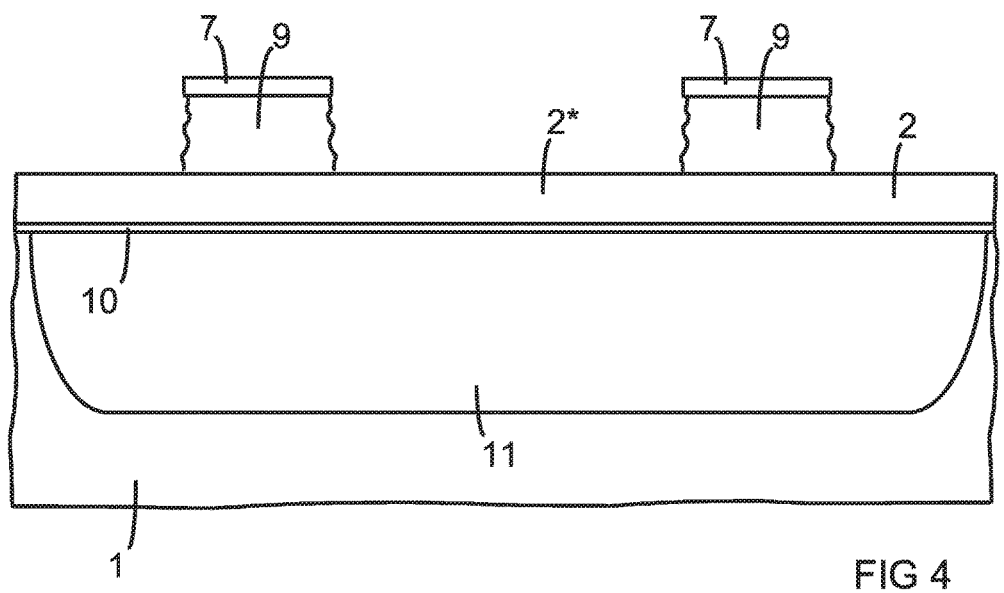
FIG. 4 is a cross section of the device at the location indicated in FIG. 1 with arrows IV.

FIG. 4 is a cross section through the portion 2* of the gate electrode layer 2 between a source contact 3 and a body contact 5. It shows the substrate 1 with the body well 11 and the gate electrode layer 2, which is arranged on the gate dielectric 10. FIG. 4 also shows part of the intermetal dielectric 9, on which the first portion 7 of the first metal layer is applied. The source region 12 and the body contact region 15 are not shown in FIG. 4, because the portion 2* of the gate electrode layer 2 does not overlap with the source region 12 and the body contact region 15.

Figure 5:
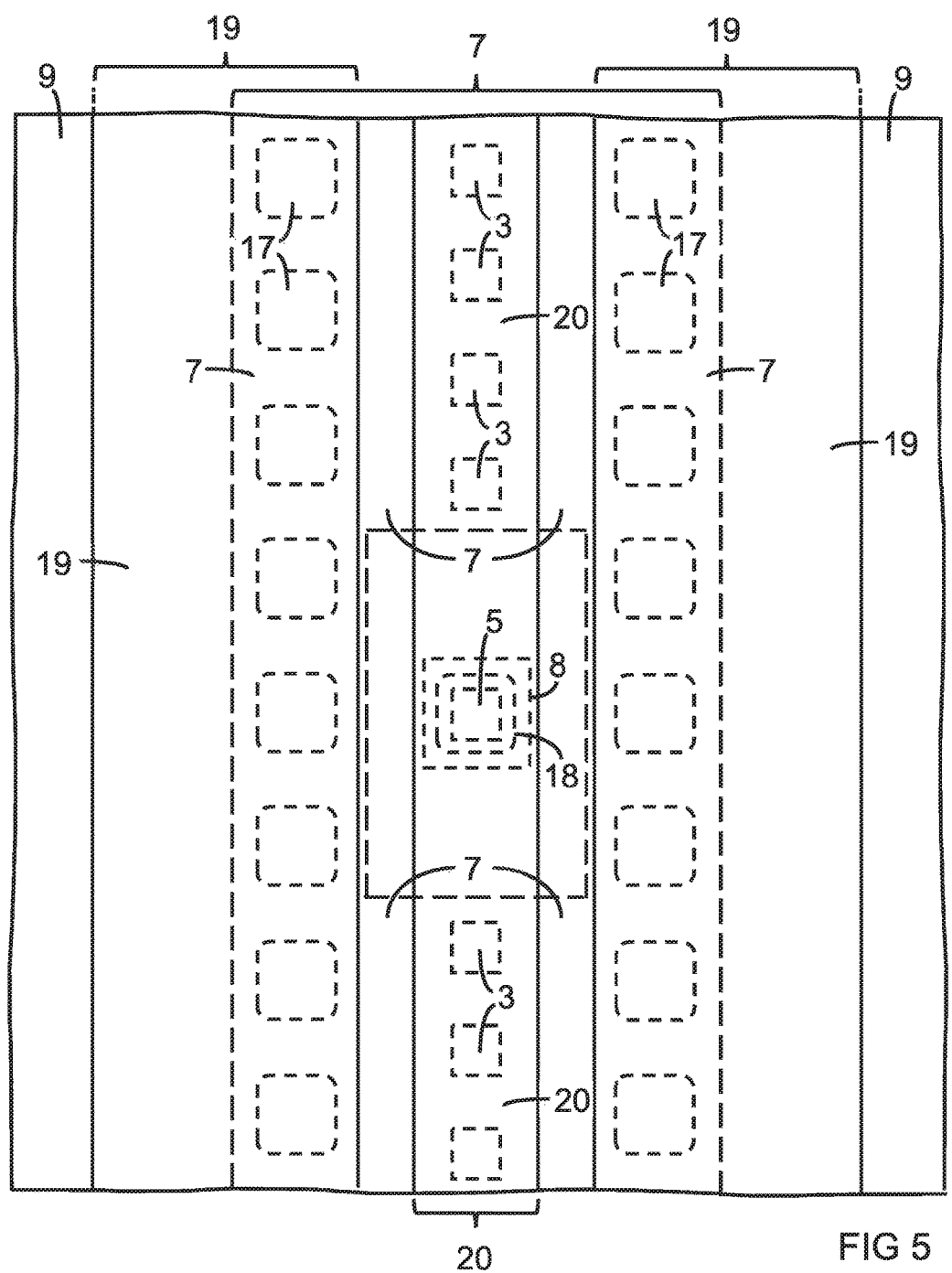
FIG. 5 is a section of a top view according to FIG. 1 including a second metal layer.

FIG. 5 is a section of a top view according to FIG. 1 including a second metal layer. The first portion 7 of the first metal layer is connected to a first portion 19 of the second metal layer by a plurality of first vias 17, which are vertical electric interconnections between the first and second metal layers. The second portion 8 of the first metal layer is connected to a second portion 20 of the second metal layer by a second via 18 or by a plurality of second vias 18.

In FIG. 5, the first metal layer 7, 8 is assumed to be covered with the intermetal dielectric 9 and is therefore shown with broken lines, whereas the second metal layer 19, 20 is assumed to be uncovered. The positions of the source contacts 3 and the body contact 5 are also indicated.

Figure 6:
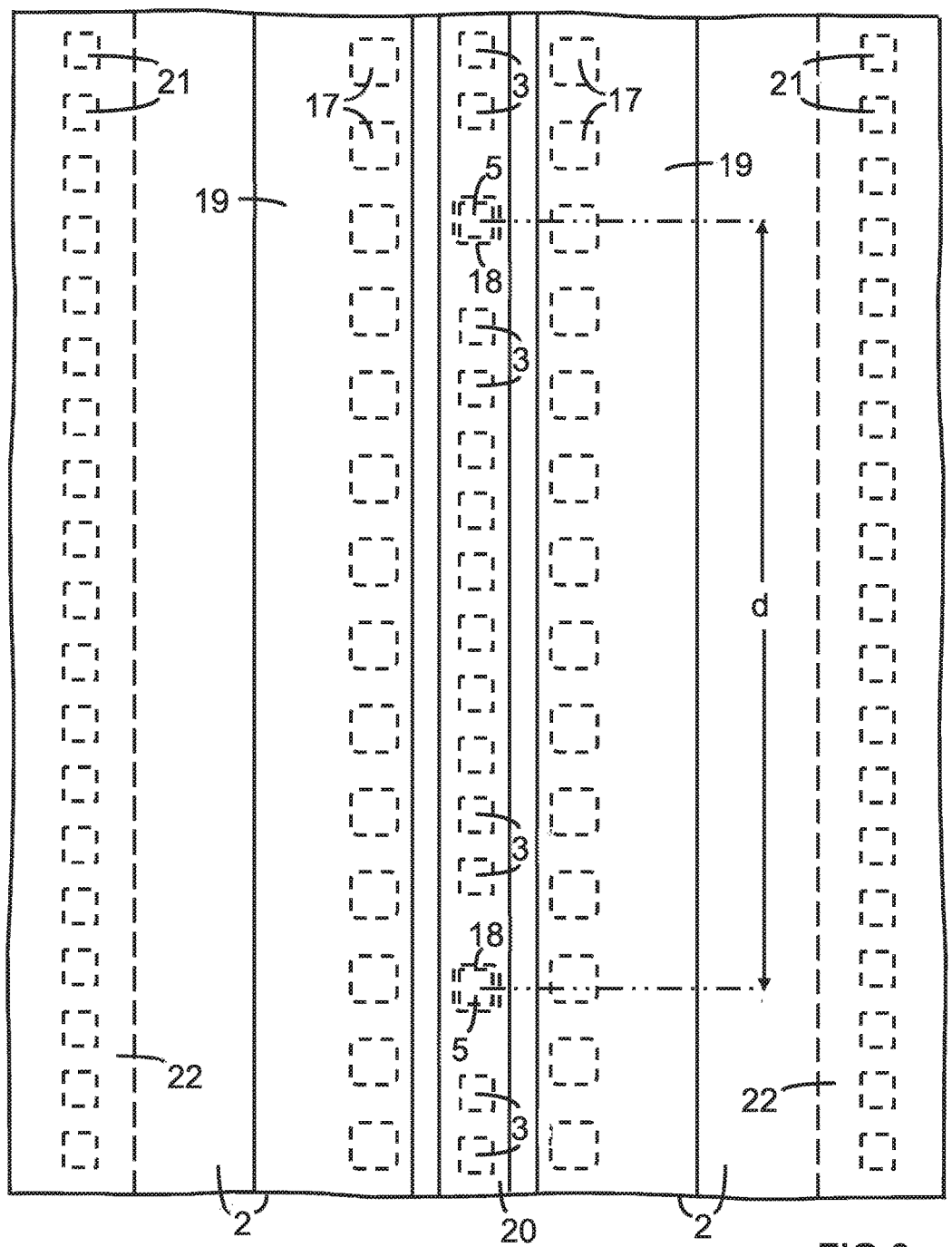
FIG. 6 is a top view of a larger area of the device including the drain contacts.

FIG. 6 is a top view of a larger area of the device including the drain contacts. FIG. 6 shows the gate electrode layer 2, the source contacts 3, the body contacts 5, the first vias 17, the second vias 18, the first portion 19 of the second metal layer and the second portion 20 of the second metal layer. Drain contacts 21 are applied on drain regions 22 in the substrate 1, which are present on two opposite lateral sides of the gate electrode layer 2 in a symmetrical arrangement. The drain contacts 21 are arranged on two straight lines, which are parallel and at equal distances from the straight line running through the centers of the source contacts 3 and the body contacts 5.

In the embodiment according to FIG. 6, the arrangement of the regions is symmetrical. The straight line running through the centers of the source contacts 3 and the body contacts 5 is the axis of symmetry. The centers of the body contacts 5 are arranged at a distance d from one another. The arrangement of a group of source contacts 3 and a body contact 5 or group of body contacts 5 may periodically be repeated along the axis of symmetry, so that the body contacts 5 are regularly arranged between the source contacts 3.

The described implantation of the body contact region, which is self-aligned to the gate electrode layer, reduces the size of the transistor cell and thus increases the number of transistor cells that can be disposed in a limited area. The specific on-resistance, which is measured in $\Omega \cdot mm^2$, is reduced, because the distance of the body contacts from the channel region is smaller than in conventional devices.

We claim:

1. A field effect transistor device, comprising:
   a substrate of semiconductor material;
   a body well of a first type of electric conductivity in the substrate;
   a source region in the body well, the source region having an opposite second type of electric conductivity;
   a source contact on the source region;
   a body contact region of the first type of electric conductivity in the body well;
   a body contact on the body contact region;
   a gate electrode layer partially overlapping the body well;
   a portion of the gate electrode layer being present between the source contact and the body contact;
   a source spacer at the gate electrode layer, the source spacer being arranged between the gate electrode layer and the source contact; and
   a body spacer at the gate electrode layer, the body spacer being arranged between the gate electrode layer and the body contact.

2. The field effect transistor device according to claim 1, wherein areas of the substrate under the source spacer and under the body spacer are free from silicide.

3. A field effect transistor device, comprising:
   a substrate of semiconductor material;
   a body well of a first type of electric conductivity in the substrate;
   a source region in the body well, the source region having an opposite second type of electric conductivity;
   a first source contact on the source region;
   a body contact region of the first type of electric conductivity in the body well;
   a first body contact on the body contact region;
   a gate electrode layer partially overlapping the body well;

a portion of the gate electrode layer being present between the first source contact and the first body contact; and a plurality of source contacts on a straight line, the first source contact being one of the source contacts of the plurality of source contacts.

4. The field effect transistor device according to claim 3, further comprising:

a plurality of body contacts arranged on the straight line at a distance from one another, the first body contact being one of the body contacts of the plurality of body contacts.

5. The field effect transistor device according to claim 4, wherein the same number of the source contacts is arranged between any two of the body contacts that are spaced apart at said distance from one another.

6. The field effect transistor device according to claim 3 or 4, wherein the portion of the gate electrode layer is present on the straight line between the first source contact and the first body contact.

7. A field effect transistor device, comprising:
a substrate of semiconductor material;
a body well of a first type of electric conductivity in the substrate;
a source region in the body well, the source region having an opposite second type of electric conductivity;
a source contact on the source region;
a body contact region of the first type of electric conductivity in the body well;
a body contact on the body contact region;
a gate electrode layer partially overlapping the body well;
a portion of the gate electrode layer being present between the source contact and the body contact;
a source extension of the second type of electric conductivity, the source extension extending the source region under the gate electrode layer, the electric conductivity of the source extension being lower than the electric conductivity of the source region; and
a halo implant of the first type of electric conductivity, the source extension being embedded in the halo implant.

8. A field effect transistor device, comprising:
a substrate of semiconductor material;
a body well of a first type of electric conductivity in the substrate;
a source region in the body well, the source region having an opposite second type of electric conductivity;
a source contact on the source region;
a body contact region of the first type of electric conductivity in the body well;
a body contact on the body contact region;
a gate electrode layer partially overlapping the body well; and
a portion of the gate electrode layer being present between the source contact and the body contact;
wherein the body contact is laterally surrounded by the gate electrode layer.

9. A field effect transistor device, comprising:
a substrate of semiconductor material;
a body well of a first type of electric conductivity in the substrate;
a source region in the body well, the source region having an opposite second type of electric conductivity;
a source contact on the source region;
a body contact region of the first type of electric conductivity in the body well;
a body contact on the body contact region;
a gate electrode layer partially overlapping the body well;
a portion of the gate electrode layer being present between the source contact and the body contact;
a first metal layer;
a first portion of the first metal layer contacting the source contact; and
a second portion of the first metal layer contacting the body contact.

10. The field effect transistor device according to claim 9, further comprising:
a second metal layer;
a first via, the first portion of the first metal layer being connected to a first portion of the second metal layer by the first via; and
a second via, the second portion of the first metal layer being connected to a second portion of the second metal layer by the second via.

11. A method of producing a field effect transistor device, comprising:
forming a body well of a first type of electric conductivity in a substrate of semiconductor material;
forming a source region in the body well, the source region having an opposite second type of electric conductivity;
forming a gate electrode layer partially overlapping the body well;
forming a body spacer at the gate electrode layer, the body spacer covering an area of the substrate that is free from silicide and surrounding an area provided for a body contact region;
forming the body contact region of the first type of electric conductivity self-aligned to the gate electrode layer and to the body spacer by an implantation of dopant in the body well;
applying a body contact on the body contact region; and
applying a source contact on the source region, a portion of the gate electrode layer being present between the source contact and the body contact.

12. The method of producing a field effect transistor device according to claim 11, further comprising:
forming a source spacer at the gate electrode layer, the source spacer covering an area of the substrate that is free from silicide and surrounding an area provided for the source region; and
forming the source region self-aligned to the gate electrode layer and to the source spacer by an implantation of a further dopant.

13. The method of producing a field effect transistor device according to claim 11 or 12, further comprising:
forming a halo implant in an area provided for the source region by an implantation of dopant for the first type of electric conductivity, and
forming a source extension in the halo implant by an implantation of dopant for the second type of electric conductivity, the source extension extending the source region under the gate electrode layer, the electric conductivity of the source extension being lower than the electric conductivity of the source region.

14. The method of producing a field effect transistor device according to claim 13, further comprising:
performing the implantation of dopant for the second type of electric conductivity that is provided for the source extension also in an area provided for the body contact region; and
forming the body contact region by an implantation of dopant for the first type of electric conductivity, which overcompensates the implantation for the second type of conductivity and results in a net doping of the first type of electric conductivity throughout the body contact region.

15. The method of producing a field effect transistor device according to claim 14, wherein the implantation of the body contact region is deeper than the implantation of the source extension.

16. The method of producing a field effect transistor device according to claim 11, further comprising:
  forming a plurality of source contacts on a straight line, the source contact being one of the source contacts of the plurality of source contacts;
  forming a plurality of body contacts arranged on the straight line at a distance from one another, the body contact being one of the body contacts of the plurality of body contacts; and
arranging the portion of the gate electrode layer on the straight line between the source contact and the body contact.

* * * * *